US008089386B2

(12) United States Patent
Konrad et al.

(10) Patent No.: US 8,089,386 B2
(45) Date of Patent: Jan. 3, 2012

(54) ISOLATION UNIT FOR A CONVENTIONAL 2-CONDUCTOR COMMUNICATION CONNECTION INCLUDING A SENSOR, A MEASUREMENT TRANSMITTER AND A CONTROL UNIT

(75) Inventors: Michael Konrad, Pfronten (DE); Michael Korn, Marktoberdorf (DE)

(73) Assignee: Endress + Hauser Wetzer GmbH + Co. KG, Nesselwang (DE)

( * ) Notice: Subject to any disclaimer, the term of this patent is extended or adjusted under 35 U.S.C. 154(b) by 150 days.

(21) Appl. No.: 12/309,946

(22) PCT Filed: Jul. 16, 2007

(86) PCT No.: PCT/EP2007/057286

§ 371 (c)(1), (2), (4) Date: Aug. 5, 2009

(87) PCT Pub. No.: WO2008/015096

PCT Pub. Date: Feb. 7, 2008

(65) Prior Publication Data

US 2009/0303090 A1 Dec. 10, 2009

(30) Foreign Application Priority Data

Aug. 4, 2006 (DE) ......................... 10 2006 036 909

(51) Int. Cl.
*H03M 1/12* (2006.01)

(52) U.S. Cl. ....................................... 341/155; 341/144

(58) Field of Classification Search .................. 341/155, 341/144, 143, 142, 139, 137; 375/135, 136
See application file for complete search history.

(56) References Cited

U.S. PATENT DOCUMENTS

| | | | | |
|---|---|---|---|---|
| 7,050,831 | B2 * | 5/2006 | Meiksin et al. | 455/560 |
| 7,652,602 | B2 * | 1/2010 | Miettinen | 341/141 |
| 7,821,428 | B2 * | 10/2010 | Leung et al. | 341/101 |
| 2002/0082799 | A1 | 6/2002 | Pramanik | |
| 2008/0191685 | A1 * | 8/2008 | Dhuyvetter et al. | 324/118 |

FOREIGN PATENT DOCUMENTS

| | | | |
|---|---|---|---|
| CN | 1064166 | A | 9/1992 |
| CN | 1187253 | A | 7/1998 |
| CN | 1607479 | A | 4/2005 |
| DE | 196 46 219 | A1 | 12/1997 |
| DE | 199 30 661 | A1 | 1/2001 |
| DE | 103 52 307 | A1 | 6/2005 |
| EP | 1 416 253 | A2 | 5/2004 |
| WO | WO 2005/045782 | A2 | 5/2005 |
| WO | WO 2005/104056 | A2 | 11/2005 |

* cited by examiner

*Primary Examiner* — Peguy Jean Pierre
(74) *Attorney, Agent, or Firm* — Bacon & Thomas, PLLC

(57) ABSTRACT

For a conventional 2-conductor communication connection, which includes a sensor, a measurement transmitter and a control unit, an isolation unit is provided, which serves for transmission of digital signals, which are not transmitted by the measurement transmitter. Thus, in the case of a conventional 2-conductor communication connection, digital communication between the sensor and the control unit becomes possible.

5 Claims, 3 Drawing Sheets

ISOLATION UNIT FOR A CONVENTIONAL 2-CONDUCTOR COMMUNICATION CONNECTION INCLUDING A SENSOR, A MEASUREMENT TRANSMITTER AND A CONTROL UNIT

TECHNICAL FIELD

The invention relates to an isolation unit for a conventional 2-conductor communication connection, including a sensor, a measurement transmitter and a control unit.

BACKGROUND DISCUSSION

In process automation technology, field devices are often applied for registering and/or influencing process variables. Examples of such field devices include fill level measuring devices, mass flow measuring devices, pressure- and temperature-measuring devices, pH-redox-potential measuring devices, conductivity measuring devices, etc., which, as sensors, register the process variables, fill-level, flow, pressure, temperature, pH-value and conductivity value, respectively.

Serving for influencing process variables are so-called actuators, e.g. valves, which control the flow of a liquid in a section of pipeline, or pumps, which change fill-level in a container.

A large number of such field devices are available from the firm, Endress+Hauser.

Most often, field devices are connected with superordinated units, e.g. control systems or control units. The superordinated units serve for process control, process visualizing, process monitoring.

Signal transmission between field devices and the superordinated units is frequently accomplished according to the known 4-20 mA standard by means of a 2-conductor communication connection.

If the field devices are sensors, the measured values registered by them are transmitted as electrical current signals via a signal line to the superordinated units. The measuring range of the sensors is, in such case, mapped linearly onto a 4-20 mA electrical current signal.

Often, today, sensors are not connected directly with the control unit, but, instead, via a measurement transmitter. In the measurement transmitter, there is, as a rule, galvanic isolation between the input signal delivered by the sensor and the output signal forwarded to the control unit.

Besides a 4-20 mA signal transmission, with some sensors, a digital, bidirectional communication is also possible. In process automation technology, such communication is accomplished, most often, according to the widely distributed HART-standard. In this way, sensors can be configured and parametered from a control system. Furthermore, besides the actual 4-20 mA measured value, also diagnostic information can be transmitted digitally to the control system.

Conventional measurement transmitters with galvanic signal isolation do not, however, permit pass-through of HART signals. A HART-enabled sensor cannot, therefore, when connected with a control system via such a measurement transmitter, communicate digitally with the control system.

SUMMARY OF THE INVENTION

An object of the present invention is to provide an isolation unit for an existing, analog, 2-conductor, communication connection between a sensor and a control unit, not having the above mentioned disadvantages, and enabling, especially during use of conventional measurement transmitters, additionally, transmission of HART signals.

This object is achieved by providing an isolation unit for a conventional 2-conductor communication connection, wherein the isolation unit serves for transmission of digital signals and can be inserted in series into existing current loops, the isolation unit serves for transmission of digital signals between said sensor and said control unit and can be inserted in series on the input side into the first electrical current loop and on the output side into the second electrical current loop.

Advantageous further developments are set forth in the dependent claims.

Advantageously, the digital signals are FSK-signals.

The isolation unit provides, also, galvanic isolation of the signals.

BRIEF DESCRIPTION OF THE DRAWINGS

In the following, the invention is explained in greater detail on the basis of an example of an embodiment illustrated in the drawing, the figures of which show as follows.

DETAILED DISCUSSION

Figure 1:
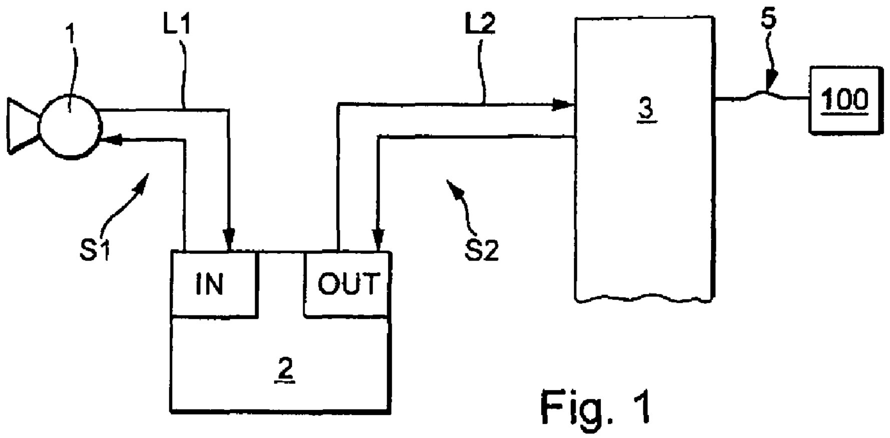
FIG. 1 schematic drawing of a 2-conductor communication connection with a conventional measurement transmitter.

FIG. 1 shows a 2-conductor communication connection between a sensor and a control unit in greater detail. Thus, a sensor 1 (e.g. a temperature sensor) delivers a 4-20 mA measurement signal via a 2-conductor line L1 to a measurement transmitter 2. The measurement transmitter 2 is connected via an additional 2-conductor line L2 with a control unit 3, e.g. a PLC. The control unit 3 can e.g. operate an actuator, e.g. a valve.

Additionally, control unit 3 is connected via a bus system 5 with a control system 100. Bus system 5 can be e.g. a Profibus system.

In the measurement transmitter 2, the 4-20 mA measurement signal coming from sensor 1 via the first electrical current loop S1 and reflecting the currently measured temperature value is preprocessed, e.g. linearized, before being forwarded to the control unit 3. A particular measurement transmitter, the RMA422 measurement transmitter of the firm, Endress+Hauser, has, instead of one measurement signal input, two measurement signal inputs. Thus, in the case of such measurement transmitter, measurement signals of two sensors can e.g. be compared or utilized.

In the measurement transmitter 2, galvanic isolation is effected between the 4-20 mA input signal and the 4-20 mA output signal forwarded via the second electrical current loop S2 to the control unit 3. Power for sensor 1, and possibly also the measurement transmitter 2, comes from the 4-20 mA signal of the second electrical current loop S2.

Figure 2:
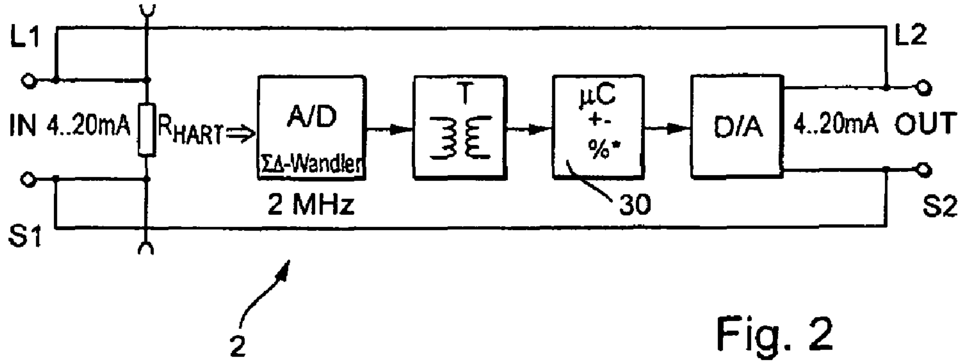
FIG. 2 schematic drawing of a conventional measurement transmitter.

FIG. 2 shows, in greater detail, a typical conventional measurement transmitter with galvanic isolation. The 4-20 mA measurement signal coming from sensor 1 via the first electrical current loop S1 is tapped at a measurement resistor $R_{HART}$ and digitized in an analog-digital converter A/D. The analog-digital converter A/D can be e.g. a ΣΔ-converter. Following digitizing, the measurement signal is fed via a galvanic-isolation transfer component T to a computing unit 30 (e.g. a microcontroller). In computing unit 30, the digitized measurement signal undergoes processing, e.g. a linearizing or a filtering. Following the processing, the digital measurement signal is converted via a digital-analog converter D/A back into a 4-20 mA signal and forwarded in analog form via the electrical current loop S2 to the control unit 3.

Shown in FIG. 2 is only the path for the digitized 4-20 mA signal, which is galvanically isolated with the help of the transfer component T. The path for energy transmission is, in order to avoid clutter, not presented. Also in such case, galvanic isolation is provided.

Signal transmission in the transfer component T can occur e.g. inductively via a coil pair or optically via an optocoupler pair.

The A/D converters installed in conventional measurement transmitters are so designed, that HART-signals cannot be transmitted. HART communication is based on the Bell 202 communications standard with encoding according to the FSK-method (Frequency Shift Keying), in the case of which the two digital states 0 and 1 are associated with the following frequencies: logic 0=2200 Hertz, logic 1=1200 Hertz.

Figure 3:
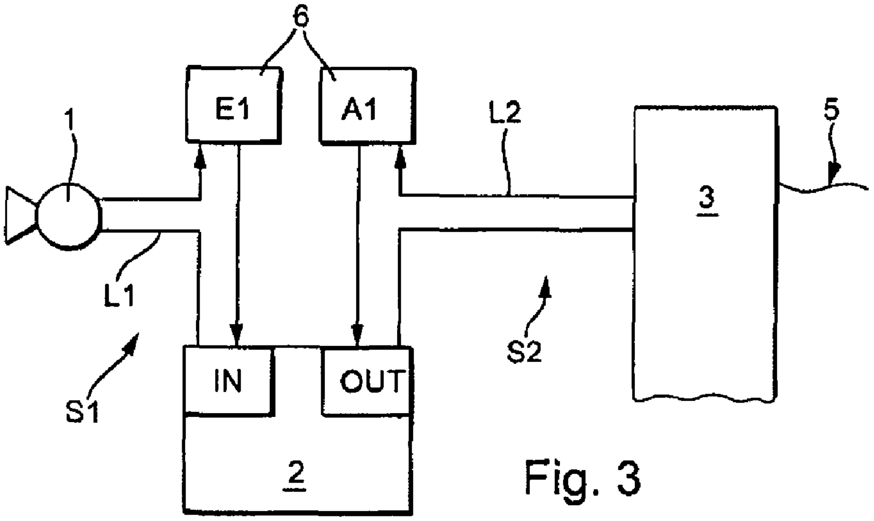
FIG. 3 schematic drawing of a 2-conductor communication connection equipped with an isolation unit of the invention.

FIG. 3 shows a 2-conductor communication connection according to FIG. 1, wherein additionally an isolation unit 6 of the invention is provided. On the input side, the isolation unit 6 of the invention is inserted into the 2-conductor line L1, while, on the output side, it is inserted into the 2-conductor line L2.

Sensor 1, the signal input I1 of the isolation unit 6 and the signal input IN of the measurement transmitter 2 are parts of a first 4-20 mA electrical current loop S1. The same is true for the control unit 3, the signal output O1 of the isolation unit 6 and the signal output OUT of the measurement transmitter 2, such being parts of a second 4-20 mA electrical current loop.

The individual components all obtain their power from the electrical current flowing in the second electrical current loop S2.

Measurement transmitter 2 transmits the analog 4-20 mA signal. According to the invention, isolation unit 6 transmits only the HART-signals, also with galvanic isolation.

Figure 4:
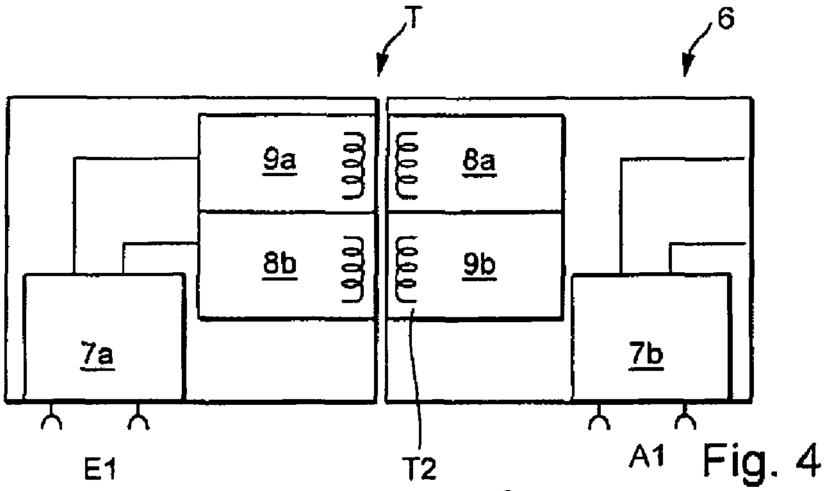
FIG. 4 schematic drawing of an isolation unit of the invention according to a first example of embodiment.

FIG. 4 shows a first example of an embodiment of isolation unit 6 in greater detail. The signal input I1 of the isolation unit 6 is connected with a HART-modem 7*a*. HART-modem 7*a* communicates via a galvanic-isolation transfer component T with an additional HART-modem 7*b*. Galvanic isolation is accomplished in the transfer component T inductively via two coil pairs 9*a*/8*a* and 8*b*/9*b*. HART-modem 7*b* is connected with the signal output O1 of the isolation unit 6.

Figure 5:
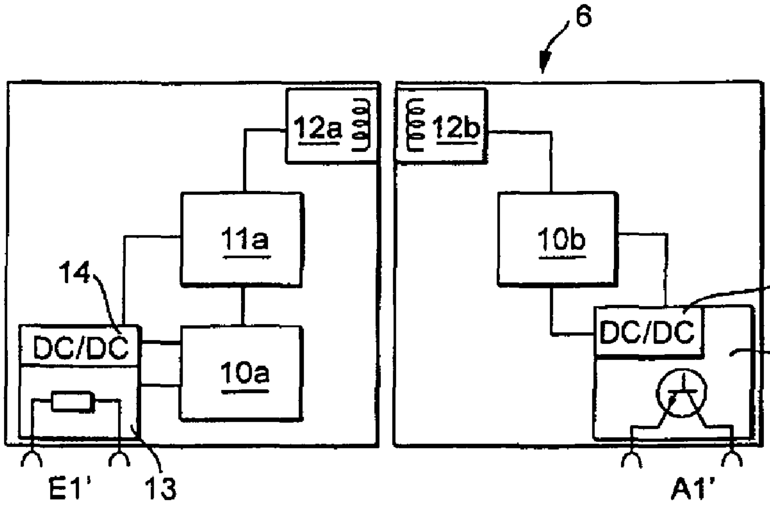
FIG. 5 schematic drawing of an isolation unit of the invention according to a second example of an embodiment.

FIG. 5 shows an alternative embodiment of isolation unit 6 in greater detail, wherein isolation unit 6 has a signal input I1' and a signal output O1'. Provided on the input side is a HART-interface module 13 containing a DC/DC-converter 14. The DC/DC-converter 14 supplies power to a coding device 10*a* as well as to a microcontroller 11*a*. In the coding device 10*a*, the HART-signal is encoded, or decoded, as the case may be.

Microcontroller 11*a* communicates with the coding device 10*a* for sending or receiving HART-signals. Furthermore, the microcontroller is connected with a second coding device 10*b* via a galvanic-isolation transfer component T. Transfer component T is composed of a coil pair, or of an optocoupler pair, via which digital signals can be transmitted in simple manner with galvanic isolation.

The output side, likewise, has a HART-interface module 13 and a DC/DC-converter 14.

The HART signal coming from the sensor 1 is received by the coding device 10*a* and forwarded in digital form to the microcontroller 11*a*. The digital signal generated by the microcontroller 11 is transmitted via a coil pair 12*a*, 12*b* to a coding device 10*b*. The coding device 10*b* drives the HART-interface module 13 correspondingly, in order that the HART-signals can be forwarded to the control unit 3.

Via an isolation unit 6 as illustrated in FIG. 4 or FIG. 5, transmission of HART signals is possible in simple manner over a galvanic isolation path.

Figure 6:
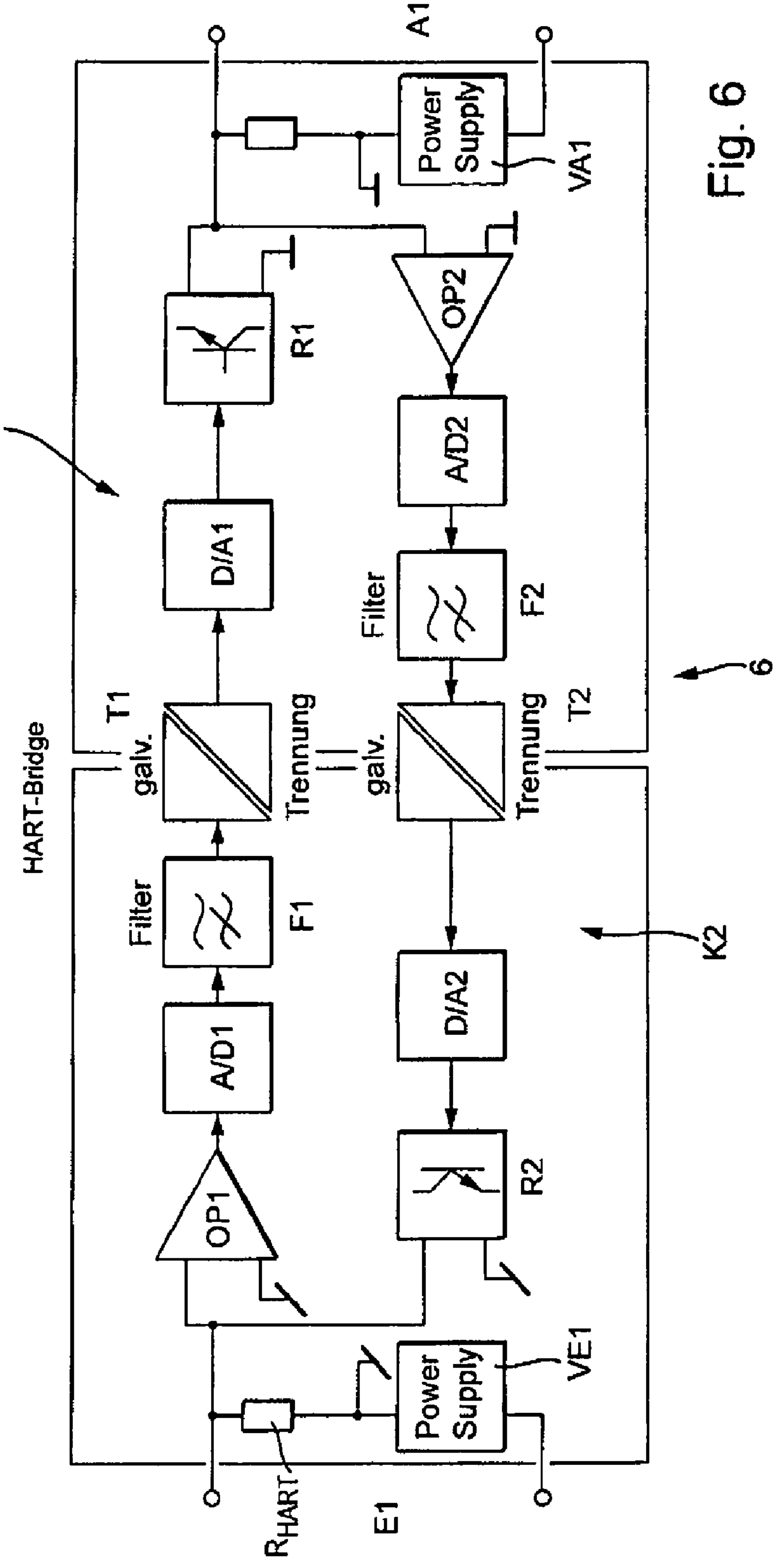
FIG. 6 a detail view of an example of embodiment according to FIG. 4.

FIG. 6 shows the example of an embodiment illustrated in FIG. 4 in somewhat more detail. The HART-signal coming from the sensor 1 is tapped at the resistor RET, amplified with an operational amplifier OP1 and then digitized with an analog-digital converter A/D1. Before the digitized signal is supplied to the transfer component T1, it is subjected to a filtering with a filter F1. Following galvanic isolation with the help of the transfer component T1, the signal is fed to a digital analog-converter D/A1, followed by a regulator R1. The input side of the isolation unit is powered by a power supply unit SI1.

Above is described, how the HART-signal coming from the sensor 1 is transmitted from the signal input I1 to the signal output O1 via a first channel K1. Correspondingly, a second channel K2 is provided, which serves for transmission of HART-signals sent from the control unit 3 to the sensor 1. Channel K2 is essentially composed of an operational amplifier OP2, an analog-digital converter A/D2, a filter F2, a transfer component T2, a digital analog-converter D/A2 and a regulator R2.

In the following, the functioning of the invention will now be explained in greater detail.

With the help of the isolation unit 6 of the invention, it is possible, given an existing conventional 2-conductor communication connection including a measurement transmitter 2, to exchange also HART-signals between a sensor and a control unit. In such case, the digital HART-signals are transmitted exclusively via the isolation unit 6, while the analog 4-20 mA measuring signals are transmitted exclusively via the conventional measurement transmitter 2. The isolation unit 6 can be easily integrated into the two existing current loops S1 and S2.

With the help of the transfer component T or T', galvanic isolation of the HART-signals is implemented in the isolation unit 6. Signal transmission via the measurement transmitter 2 is accomplished likewise with galvanic isolation.

Isolation unit 6 permits a user to utilize the complete functionality of the sensor, since now also parametering and utilizing of the HART-information is possible from the control system 100. An additional power supply is not necessary, since also the isolation unit 6 is fed via the electrical current loop S2.

Translation of German Words and/or Symbols in the Drawing

FIG. 2:

Change "Wandler" to - -converter- -.

FIG. 3:

Change "E1" to - -I1- -; and
change "A1" to - -O1- -.

FIG. 4:

Change "E1" to - -I1- -; and
change "A1" to - -O1- -.

FIG. 5:

Change "E1'" to - -I1'- -; and
change "A1'" to - -O1'- -.

FIG. 6:
Change “Trennung” to - -isolation- -;
change “E1” to - -I1- -;
change “VE1” to - -SI1- -;
change “VA1” to - -SO1- -; and
change “A1” to - -O1- -.

The invention claimed is:

1. An isolation unit for a conventional 2-conductor communication connection, said 2-conductor communication connection including:

a sensor;

a measurement transmitter; and a control unit, wherein:

the isolation unit when inserted in series on the input side into the first electrical current loop and on the output side into the second electrical current loop, serves for transmission of digital signals between said sensor and said control unit; and said measurement transmitter, for purposes of galvanic isolation, digitizes analog measurement signals coming from said sensor via a first electrical current loop on an input side, and then converts digitized analog signals back to analog signals for transmission to said control unit via a second electrical current loop on an output side.

2. The isolation unit as claimed in claim 1, wherein:

the analog measurement signals are 4-20 mA signals and the digital signals are FSK-signals.

3. The isolation unit as claimed in claim 1, a transfer component is provided in the isolation unit for galvanic isolation of signals.

4. The isolation unit as claimed in claim 1, wherein:

the isolation unit is supplied with power via the electrical current loop.

5. An isolation unit for a conventional 2-conductor communication connection, said 2-conductor communication connection including:

a sensor;

a measurement transmitter; and a control unit, wherein:

said measurement transmitter, for purposes of galvanic isolation, digitizes analog measurement signals coming from said sensor via a first electrical current loop on an input side, and then converts digitized analog signals back to analog signals for transmission to said control unit via a second electrical current loop on an output side;

the isolation unit when inserted in series on the input side into the first electrical current loop and on the output side into the second electrical current loop and serves for transmission of digital signals between said sensor and said control unit; and the isolation unit has a channel for transmission of FSK-signals from said sensor to said control unit and a channel for transmission of FSK-signals from said control unit to said sensor; and each channel has an A/D-converter, a filter, a transfer component and a D/A-converter.

* * * * *